(12) United States Patent
Seo et al.

(10) Patent No.: US 7,439,192 B2
(45) Date of Patent: Oct. 21, 2008

(54) METHOD OF FORMING A LAYER ON A SEMICONDUCTOR SUBSTRATE

(75) Inventors: Jung-Hun Seo, Gyeonggi-do (KR);
Young-Wook Park, Gyeonggi-do (KR);
Jin-Gi Hong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

(21) Appl. No.: 11/154,110

(22) Filed: Jun. 15, 2005

(65) Prior Publication Data

US 2006/0000411 A1    Jan. 5, 2006

(30) Foreign Application Priority Data

Jul. 5, 2004    (KR) .................. 10-2004-0051855

(51) Int. Cl.
*H01L 21/31*    (2006.01)
(52) U.S. Cl. .................. 438/775; 438/676; 438/685; 438/758; 438/E21.171
(58) Field of Classification Search ......... 438/758–763, 438/674–685, 627–629
See application file for complete search history.

(56) References Cited

U.S. PATENT DOCUMENTS

| | | | | |
|---|---|---|---|---|
| 6,139,700 A * | 10/2000 | Kang et al. | ............ | 204/192.17 |
| 6,289,842 B1 | 9/2001 | Tompa | | |
| 6,592,942 B1 * | 7/2003 | Van Wijck | ............. | 427/255.34 |
| 6,989,338 B2 * | 1/2006 | Choi et al. | .................. | 438/795 |
| 2004/0224475 A1 * | 11/2004 | Lee et al. | ..................... | 438/399 |

FOREIGN PATENT DOCUMENTS

| | | |
|---|---|---|
| JP | 2003-218106 | 7/2003 |
| KR | 2001-0007344 | 1/2001 |
| KR | 2002-0002741 | 1/2002 |
| KR | 2003-0061952 | 7/2003 |
| KR | 2004-0001500 | 1/2004 |

OTHER PUBLICATIONS

English language abstract of the Korean Publication No. 2001-0007344.
English language abstract of the Korean Publication No. 2002-0002741.
English language abstract of the Korean Publication No. 2004-0001500.
English language abstract of Korean Publication No. 2003-0061952.
English language abstract of Japanese Publication No. 2003-218106.

* cited by examiner

*Primary Examiner*—Dung A. Le
(74) *Attorney, Agent, or Firm*—Marger Johnson & McCollom, P.C.

(57) ABSTRACT

In a method of forming a thin layer for a semiconductor device through an ALD process and a CVD process in the same chamber, a semiconductor substrate is introduced into a processing chamber, and an interval between a showerhead and the substrate is adjusted to a first gap distance. A first layer is formed on the substrate at a first temperature through an ALD process. The interval between the showerhead and the substrate is additionally adjusted to a second gap distance, and a second layer is formed on the first layer at a second temperature through a CVD process. Accordingly, the thin layer has good current characteristics, and the manufacturing throughput of a semiconductor device is improved.

11 Claims, 13 Drawing Sheets

METHOD OF FORMING A LAYER ON A SEMICONDUCTOR SUBSTRATE

CROSS-REFERENCE OF RELATED APPLICATION

This application relies for priority upon Korean Patent Application No. 2004-51855 filed on Jul. 5, 2004, the contents of which are herein incorporated by reference in their entirety.

BACKGROUND OF THE INVENTION

1. Field of the Invention

The present invention relates to a method of forming a layer on a semiconductor substrate and an apparatus for performing the same. More particularly, the present invention relates to a method of forming a layer using an atomic layer deposition (ALD) method followed by a chemical vapor deposition (CVD) method in the same processing chamber and an apparatus for performing the same.

2. Description of the Related Art

Modern semiconductors use extremely small metal wiring. Whereas in the past aluminum (Al) has been the material of choice for such wiring due to its low specific resistance and ease of use in processing, extremely dense circuits owing to better manufacturing techniques require better conductor materials. Copper (Cu) has a much lower resistance and higher yield strength than aluminum and is thus much desired for use in semiconductor wiring. Unfortunately, copper has a major drawback in that copper atoms tend to diffuse into the silicon of the semiconductor substrate, thus affecting the performance of the semiconductor device. Additionally, copper is more difficult to dry-etch than aluminum and is difficult to adhere to other materials, thereby presenting an uneven surface between the copper and a contiguous material.

For those reasons, the copper wiring requires a diffusion barrier layer for preventing diffusion between the copper layer and the semiconductor layer or substrate so as to improve device reliability. One commonly used diffusion barrier layer include titanium nitride (TiN) due to its high strength and good conductivity. The titanium nitride (TiN) layer has also been used as an electrode of a capacitor of a semiconductor device.

However, titanium nitride (TiN) as a diffusion material creates several problems. Most importantly, titanium nitride is difficult to apply to a semiconductor substrate. Application of TiN via physical vapor deposition (PVD) often results in poor step coverage thus making such application method ill suited during highly integrated semiconductor devices. Application of TiN via organic chemical vapor deposition (MOCVD) often includes unintended contaminants such as carbon (C) and oxygen (O) thus requiring a subsequent plasma treatment process to remove the contaminants. Application of TiN via a chemical vapor deposition (CVD) process often results in diffusion of chloride ions (Cl$^-$) from a base reactant gas into an underlying layer, thus resulting in degraded electrical characteristics of the resulting device. Finally, application of TiN via an atomic layer deposition (ALD) is an extremely slow process thereby severely reducing manufacturing productivity.

Accordingly, the need remains for methods for applying a diffusion material onto a substrate that overcomes the drawbacks of the prior art.

SUMMARY OF THE INVENTION

The present invention provides a method of forming a thin layer for a semiconductor device through both an ALD process and a CVD process in the same chamber. The present invention also provides an apparatus for performing the above method.

According to an exemplary embodiment of the present invention, there is provided a method of forming a thin layer on a semiconductor substrate. A first layer is formed on the substrate at a first temperature in a processing chamber through an atomic layer deposition (ALD) process, and a second layer is formed on the first layer at a second temperature in the processing chamber through a chemical vapor deposition (CVD) process. As an exemplary present embodiment, a titanium nitride layer is formed as the thin layer on the semiconductor substrate.

According to another exemplary embodiment of the present invention, there is provided another method of forming a thin layer on a semiconductor substrate. The substrate is introduced into a processing chamber, and an interval between a showerhead and the substrate is adjusted to a first gap distance. A first layer is formed on the substrate at a first temperature through an ALD process. The interval between the showerhead and the substrate is adjusted to a second gap distance, and a second layer is formed on the first layer at a second temperature through a CVD process. In the present embodiment, a temperature of the substrate is changed from the first temperature to the second temperature by using a backside gas, such as argon (Ar) gas, before the second layer is formed.

According to still another exemplary embodiment of the present invention, there is provided an apparatus for forming a thin layer on a semiconductor substrate. A processing chamber in which the substrate is positioned is prepared, and a showerhead is installed in the apparatus. Reactants for forming the thin layer are provided onto the substrate through the showerhead. An adjusting unit for adjusting a gap distance between the showerhead and the substrate is also installed in the apparatus. In the present embodiment, the apparatus further includes a stage for supporting the substrate. The adjusting unit includes an extendable member connected to the showerhead or the stage, and a driving member connected to the showerhead or the stage for driving the showerhead or the stage.

According to further still another exemplary embodiment of the present invention, there is provided another apparatus for forming a thin layer on a semiconductor substrate. The apparatus includes a processing chamber in which the substrate is positioned on a stage, a showerhead, and first and second adjusting units. Reactants for forming the thin layer are provided onto the substrate through the showerhead. The first adjusting unit is connected to the showerhead, and moves the showerhead close to or far off from the stage. The second adjusting unit is connected to the stage, and moves the stage close to or far off from the showerhead.

According to the present invention, the thin layer for a semiconductor device is formed through both an ALD process and a CVD process in the same chamber. The thin layer includes a first layer formed through the ALD process and a second layer formed through the CVD process. As a result, when a diffusion barrier layer or an upper electrode layer of a capacitor of a semiconductor device is formed as the thin layer of the present invention, a diffusion of impurities into an underlying layer is sufficiently prevented by the first layer formed through the ALD process, thereby preventing the deterioration of the underlying layer, the diffusion barrier layer and the upper electrode layer in a view of material characteristics. In addition, the second layer is formed through the CVD process, thereby improving a manufacturing throughput of a semiconductor device. Accordingly, the characteristics of the thin layer for a semiconductor device are remarkably improved with a superior manufacturing throughput and rare manufacturing failures.

BRIEF DESCRIPTION OF THE DRAWINGS

The above and other features and advantages of the present invention will become readily apparent by reference to the following detailed description when considering in conjunction with the accompanying drawings, in which.

DESCRIPTION OF THE EMBODIMENTS

The present invention now will be described more fully hereinafter with reference to the accompanying drawings in which exemplary embodiments of the present invention are shown.

FIGS. 1A to 1G are cross sectional views illustrating processing steps for a method of forming a thin layer for a semiconductor device according to an exemplary embodiment of the present invention.

As shown in FIGS. 1A to 1E, a semiconductor substrate 12 is positioned in a processing chamber 10, and a first layer 40 or 50 is formed on the substrate 10 at a first temperature through an ALD process. In the present embodiment, the first temperature is below about 550° C. When the first temperature is higher than about 550° C., chloride ions from the ALD process are apt to diffuse into an underlying layer thereby degrading the electrical characteristics of a titanium nitride layer from when titanium chloride gas is used as a reactant of the ALD process.

Figure 1A:
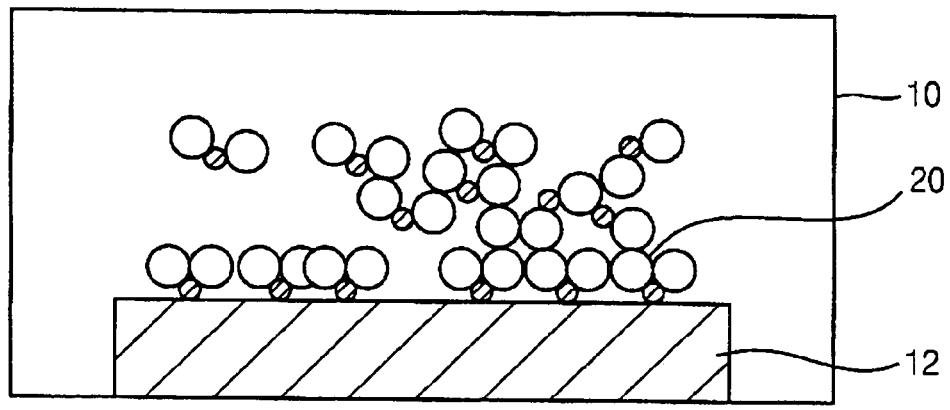
FIGS. 1A to 1G are cross sectional views illustrating processing steps for a method of forming a thin layer for a semiconductor device according to an exemplary embodiment of the present invention.

Referring to FIG. 1A, a first reactant 20 or a first reactant gas including the first reactant 20, for example, a titanium chloride ($TiCl_4$) gas, is provided into the processing chamber 10. In the present embodiment, the first reactant 20 is provided into the processing chamber 10 at a volume rate below about 25 standard cubic centimeters per minute (sccm), and more preferably at a volume rate below about 10 sccm. The ALD process has an advantage in that only a small amount of a reactant is needed for forming a uniform thin layer on a substrate; thus, a volume rate of the reactant over about 25 sccm would be uneconomical. Additionally, when the first reactant 20 is introduced into the processing chamber 10 at a volume rate over about 25 sccm, an efficiency of a subsequent purging process is reduced. The first reactant 20 is partially chemisorbed onto a surface of the substrate 12 in the processing chamber 10, so that a monolayer 30 in FIG. 1B is formed on the substrate 12.

Figure 1B:
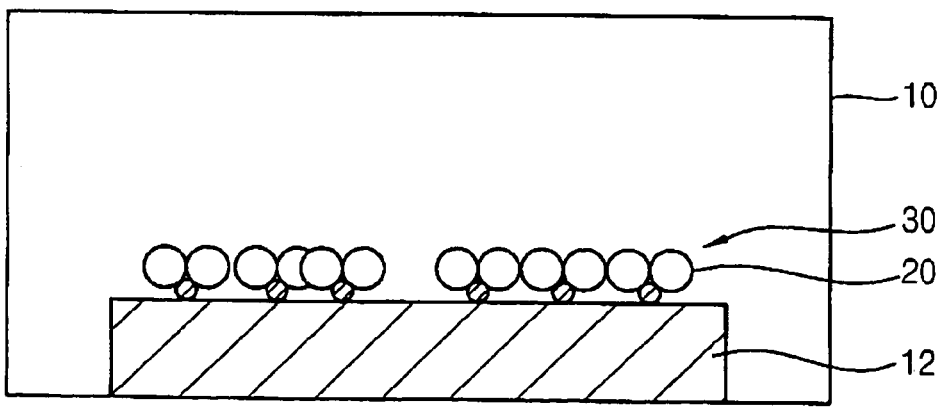

Referring to FIG. 1B, a first purge gas is provided into the processing chamber 10 and a first purging process is performed in the processing chamber 10, so that a portion of the first reactant, which is not chemisorbed onto the substrate 12, (hereinafter, referred to as a non-chemisorbed first reactant) is removed from the processing chamber 10. In the present embodiment, the non-chemisorbed first reactant includes a portion of the first reactant 20 that is physisorbed onto the surface of the substrate 12. In the present embodiment, argon (Ar) gas is exemplarily utilized as the first purge gas, and is provided into the processing chamber 10 at a volume rate of about 900 sccm.

Figure 1C:
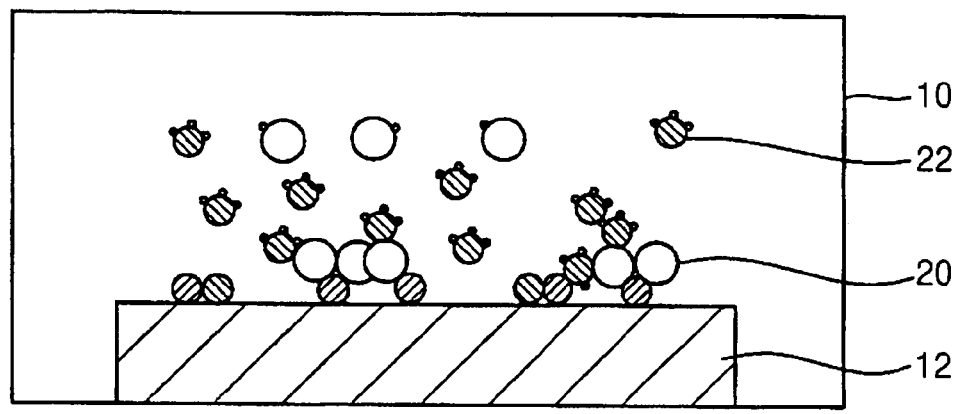

Referring to FIG. 1C, after completing the first purging process, a second reactant 22 or a second reactant gas including the second reactant 22, for example, an ammonia ($NH_3$) gas or a nitrogen ($N_2$) gas, is provided into the processing chamber 10. In the present embodiment, the second reactant 22 is provided into the processing chamber 10 at a volume rate of about 30 sccm.

Figure 1D:
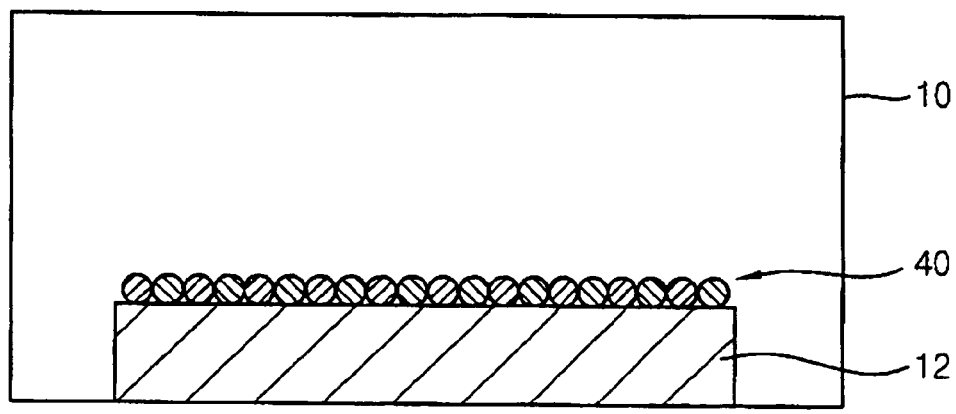
Figure 1E:
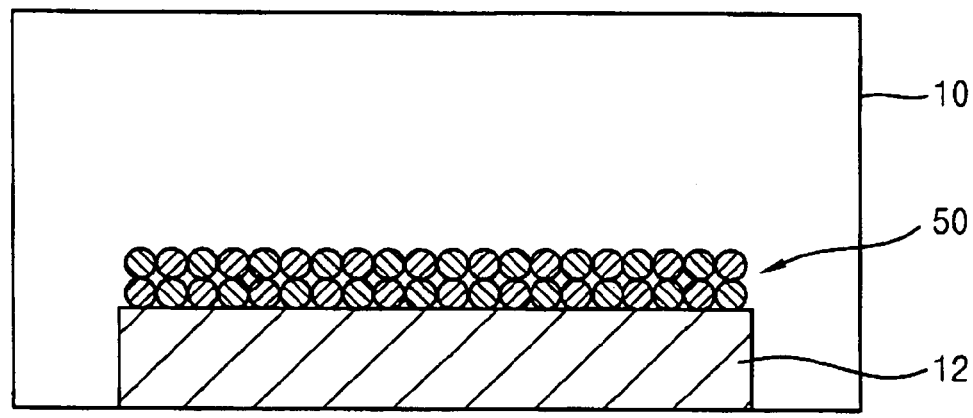

Referring to FIG. 1D, the second reactant 22 is chemically reacted to the monolayer 30, thereby forming a first layer 40 on the substrate 12. That is, the second reactant 22 is partially chemisorbed to the monolayer 30 to form the first layer 40. In the same way as the first purging process, a second purge gas is provided into the processing chamber 10 and a second purging process is performed in the processing chamber 10, so that a non-chemisorbed second reactant 22, which is not chemisorbed onto the monolayer 30, is removed from the processing chamber 10. In the same way as the first purging process, argon (Ar) gas is utilized as the second reactant 22, and is provided into the processing chamber 10 at a volume rate of about 900 sccm.

Referring to 1E, the above processes for providing the first and second reactants and the above first and second purging processes are repeated many times until the first layer 50 has a desirable thickness. In the present embodiment, the first layer 50 is formed to a thickness of about 20 Å to about 80 Å, and more preferably to a thickness of about 35 Å to 65 Å. When the first layer 50 is formed to a thickness less than the above range, there is a problem in that chloride ions (Cl−) may be diffused into an underlying layer during a subsequent CVD process. When the first layer 50 is formed to a thickness greater than the above range, a longer process time is required for forming the first layer 50, and as a result, a manufacturing throughput is reduced since it takes longer to make each device. The above process conditions for the first layer are shown in Table 1.

TABLE 1

Process Conditions for First Layer Formation

| Temperature (° C.) | | Time/Cycle | Volume Rate (sccm) | | | | | Pressure | Gap Distance |
|---|---|---|---|---|---|---|---|---|---|
| Stage | Chamber | (sec) | $TiCl_4$ | Ar | $NH_3$ | Ar | Cycle | (Torr) | (mm) |
| 530 | 170 | 5.5 | 10 | 900 | 30 | 900 | 350 | 3 | 25 |

In Table 1, the chamber temperature denotes a temperature of an inner side surface of the chamber, and the gap distance denotes an interval between the substrate 12 and the showerhead.

Figure 1F:
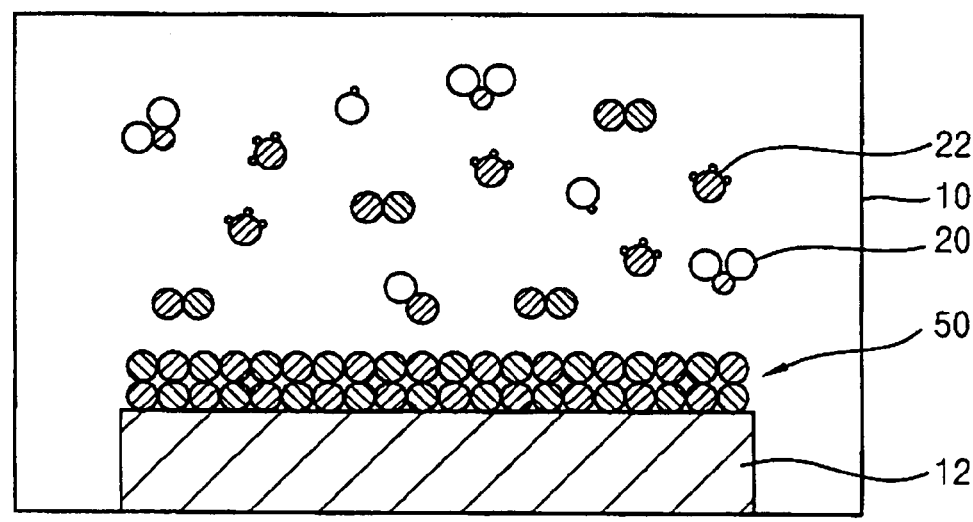
Figure 1G:
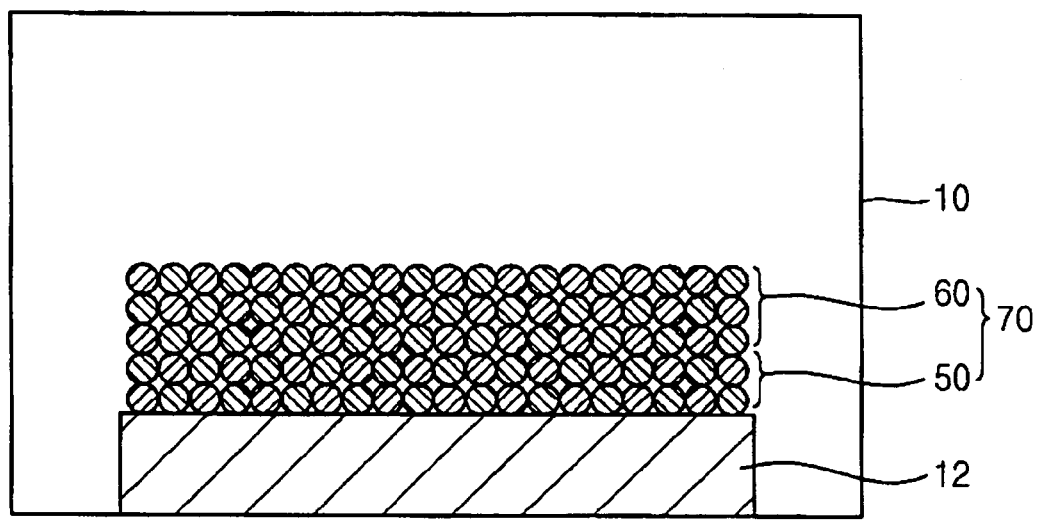

Referring to FIGS. 1F and 1G, a second layer 60 is formed on the first layer 50 at a second temperature through a CVD process in the processing chamber 10. The second temperature is set to be equal to or higher than the first temperature. In the present embodiment, the second temperature is maintained to be over about 550° C. When a titanium nitride layer is exemplarily formed through the CVD process at a temperature lower than about 550° C., a great quantity of byproducts such as $TiCl_xN_y$ (wherein, x and y are positive numbers) is generated during the deposition process, so that the electrical characteristics of the titanium nitride layer are markedly deteriorated.

In detail, referring to 1F, source gases 20 and 22 of the deposition process are provided into the processing chamber 10. Examples of the source gas 20 and 22 include a titanium chloride gas, a nitrogen gas, an ammonia gas, etc. These can be used alone or in a mixture thereof. In particular, a mixture of the titanium chloride gas and the nitrogen gas, a mixture of the titanium chloride gas and the ammonia gas, and a mixture of the titanium chloride gas, the nitrogen gas and the ammonia gas are mainly utilized as the source gases 20 and 22. In the present embodiment, the titanium chloride gas is provided into the processing chamber 10 at a volume rate of about 10 sccm, and more preferably, at a volume rate no less than about 20 sccm. When the titanium chloride gas is provided at a volume rate less than about 10 sccm during the deposition process, there is a problem in that the step coverage of the titanium nitride layer may become bad.

Referring to FIG. 1G, the source gases 20 and 22 are chemically reacted with each other in the processing chamber 10, so that chemical products are generated in the processing chamber and deposited on the first layer 50 to a desirable thickness. As a result, the second layer 60 is formed on the first layer 50 to a predetermined thickness. In the present embodiment, titanium nitride is generated in the processing chamber 10, and a titanium nitride layer is coated on the first layer 50 as the second layer 60. As an exemplary embodiment, the second layer 60 is formed to a thickness of about 150 Å to about 400 Å, or about 2-20 (and more preferably 5-8) times the thickness of the first layer 50. While the thickness of the second layer is about 150 Å to about 400 Å, the skilled person in the art will recognize that the thickness of the second layer can vary over a wide variety of ranges.

In addition, the second layer 60 may be further annealed through an annealing process. In the preset embodiment, an ammonia ($NH_3$) gas is provided to the processing chamber 10 during the annealing process at a volume rate of about 60 sccm. Various process conditions for the second layer are exemplarily shown in Table 2.

In Table 2, the chamber temperature denotes a temperature of an inner side surface of the chamber, and the gap distance denotes an interval between the substrate 12 and the showerhead.

According to the present embodiment of the invention, the thin layer 70 for a semiconductor device includes the first layer 50 formed through the ALD process and the second layer 60 formed through the CVD process. The thin layer 70 may be a diffusion barrier layer for preventing metal ions from being diffused, or an upper electrode layer or a lower electrode layer in a capacitor for a semiconductor device. In such a case, the thin layer may comprise titanium nitride, and is formed to a thickness of about 170 Å to about 480 Å.

Figure 2:
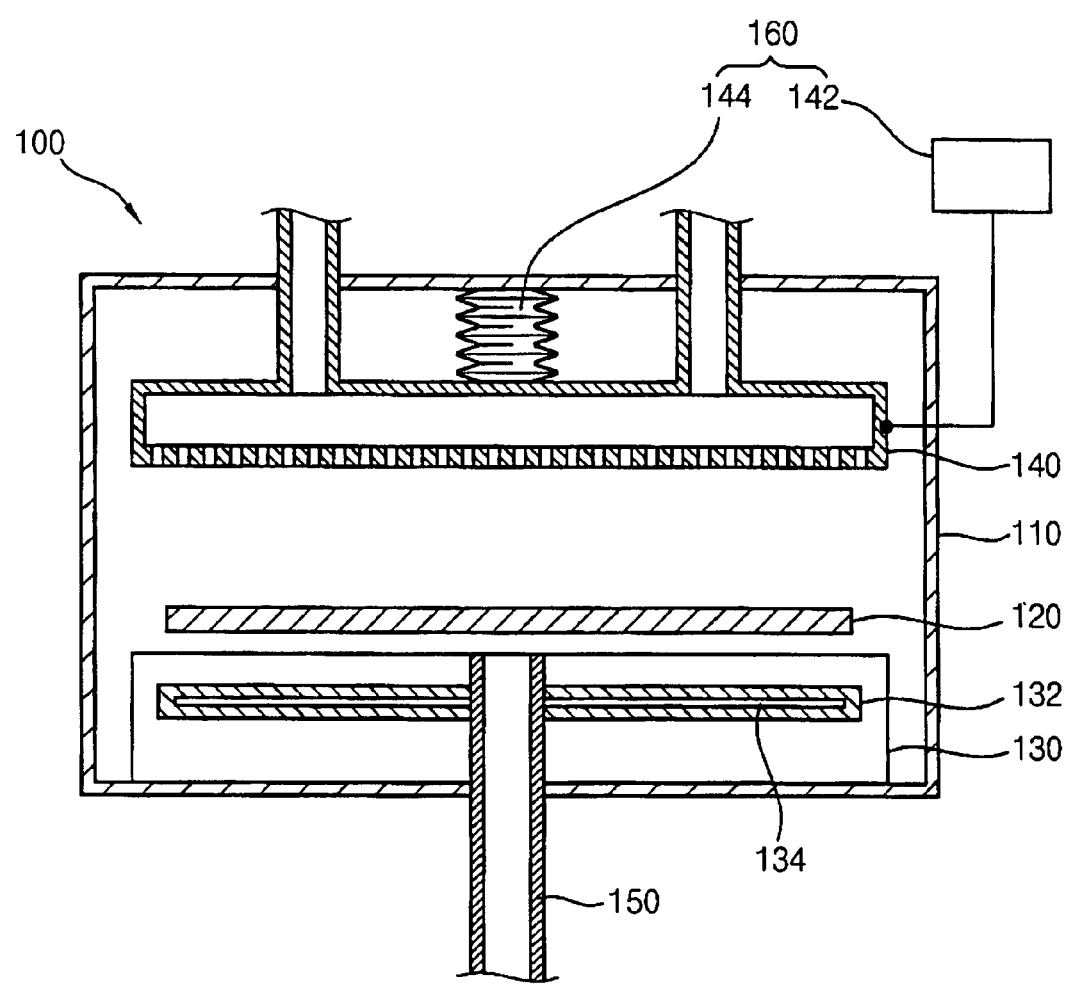
FIG. 2 is a cross sectional view illustrating an apparatus for forming a thin layer for a semiconductor device according to a first embodiment of the present invention.
Figure 3A:
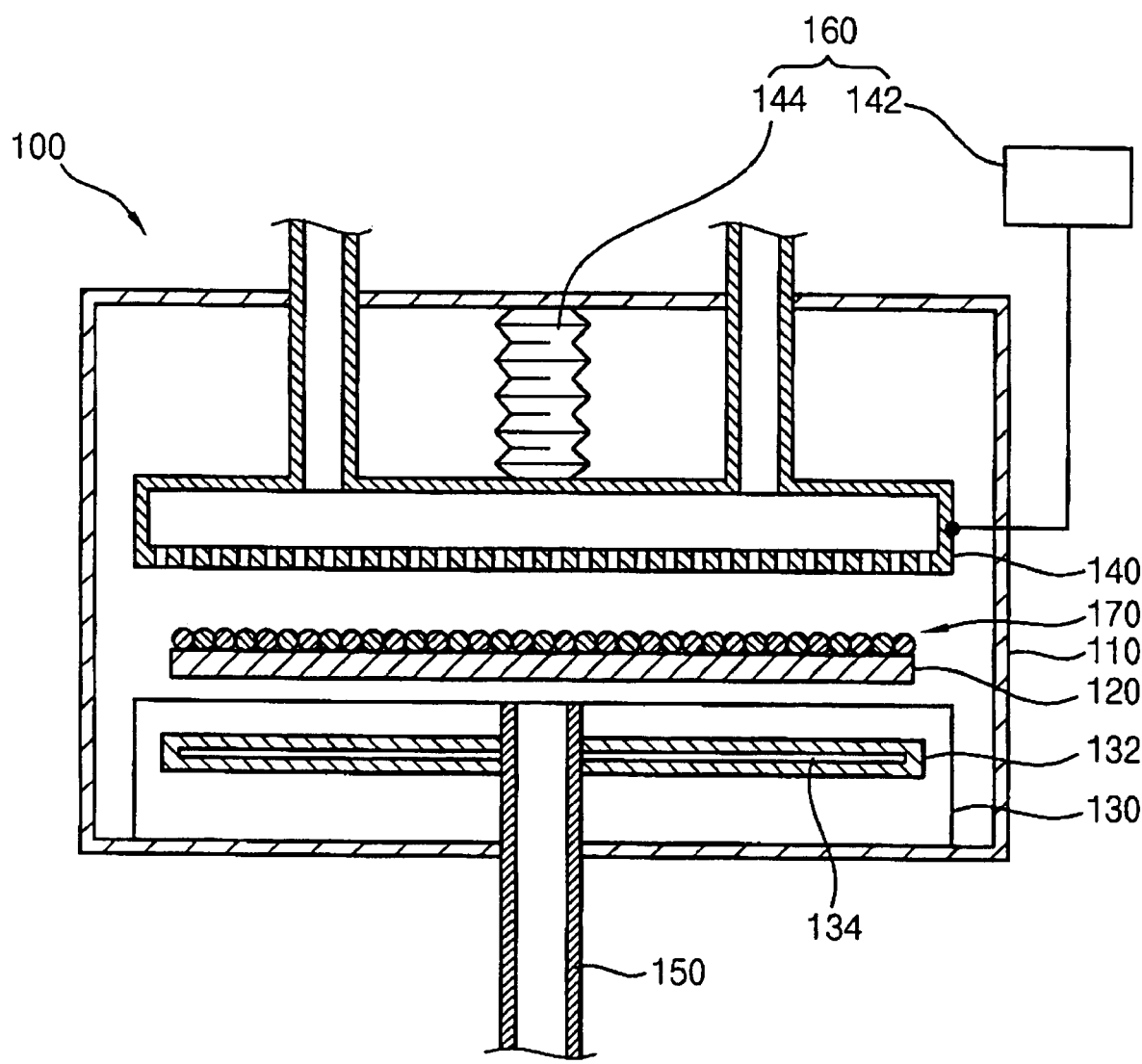
FIGS. 3A and 3B are schematic views illustrating first and second layers of the thin layer formed on a substrate in the apparatus shown in FIG. 2.
Figure 3B:
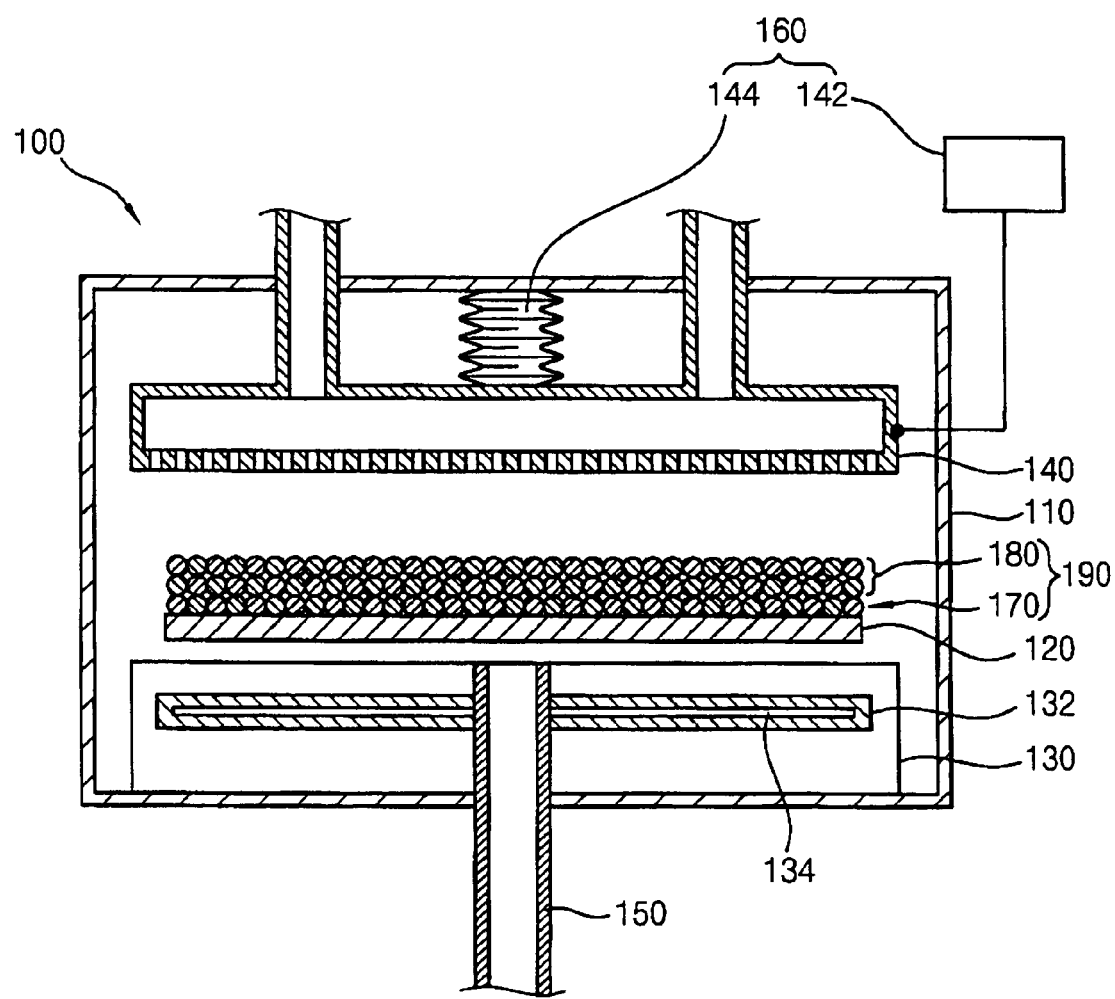

FIG. 2 is a cross sectional view illustrating an apparatus for forming a thin layer for a semiconductor device according to a first embodiment of the present invention. FIGS. 3A and 3B are schematic views illustrating first and second layers of the thin layer formed on a substrate in the apparatus shown in FIG. 2.

Referring to FIG. 2, an apparatus 100 for forming a thin layer for a semiconductor device according to a first embodiment of the present invention includes a processing chamber 110 in which a semiconductor substrate 120 is positioned, a showerhead 140 through which reactants are provided into the processing chamber 110, an adjusting unit 160 for adjusting a gap distance between the showerhead 140 and the substrate 120, and a stage 130 for supporting the substrate 120. The showerhead 140 is positioned in an upper portion of the processing chamber 110, and the stage 130 is positioned in a lower portion of the processing chamber 110 and faces the showerhead 140.

In the present embodiment, the adjusting unit 160 includes an extendable member 144 connected to both the showerhead 140 and a top portion of the chamber 110, and a driving member 142 for driving the showerhead 140.

The extendable member 144 may be extended or contracted as needed, thereby adjusting an interval between the showerhead 140 and the substrate 120 in accordance with a process for forming a layer on the substrate 120, for example, an ALD process or a CVD process. Examples of the extendable member 144 include a bellows or an antenna-structured tube. The driving member 142 includes a motor, a cylinder connected to a pressure source or a lead screw operated by manpower.

The driving member 142 is connected to the showerhead 140, and vertically drives the showerhead 140 close to the substrate 120 or far off from the substrate 120. While the present embodiment discloses the showerhead 140 driven by the driving member 142, a power source (not shown) for driving the extendable member 144 could be utilized for driving the showerhead 140, as would be known to one of the ordinary skill in the art. The power source drives the extendable member 144, and the showerhead 140 vertically moves

TABLE 2

| Process Conditions for Second Layer Formation | | | | | | | | | |
|---|---|---|---|---|---|---|---|---|---|
| Temperature (° C.) | | Pre-heating | Volume Rate (sccm) | | | | Deposition | Pressure | Gap Distance |
| Stage | Chamber | Time (sec) | $TiCl_4$ | Ar | $NH_3$ | Ar | Time (sec) | (Torr) | (mm) |
| 530 | 170 | 90 | 65 | 200 | 60 | 800 | 75 | 6 | 45 | close to the substrate 120 or far off from the substrate 120 in accordance with the vertical movement of the connected extendable member 144.

The stage 130 includes a heater 132 for increasing a temperature of the substrate 120. In the present embodiment, the heater 132 includes a heat exchanger 134 for controlling a temperature of the heater 132. As an exemplary embodiment, a heat medium of a predetermined temperature is circulated in the heat exchanger 134, or the heat exchanger 134 is wholly exposed to a cooling gas.

In addition, the apparatus 100 may further include a feeding line 150 through which a backside gas is provided to a bottom surface of the substrate 120 via the stage 130. The backside gas may increase or decrease the temperature of the substrate 120 just like the heat exchanger 134 in the heater 132. That is, the backside gas may also control the temperature of the substrate 120. In the present embodiment, an argon (Ar) gas is exemplarily utilized as the backside gas. While both the feeding line 150 and the heat exchanger 134 are installed in the apparatus 100 of the present invention, just one of either the feeding line 150 or the heat exchanger 134 may also be installed in the apparatus 100 of the present invention, as would be known to one of the ordinary skill in the art.

The apparatus 100 of the present invention may further include a plasma generator (not shown) for generating plasma during the ALD process or the CVD process. The plasma generator may include an electrode (not shown) surrounding a gas supplying line (not shown), a radio frequency (RF) source (not shown) for applying a high frequency energy to a gas supplied to the gas supplying line, and a buffer space (not shown) under the electrode where a gas supplied to the gas supplying line is excited to a plasma by the RF source. The showerhead 140 is positioned under the buffer space, and the plasma is uniformly deposited onto the substrate 120 through the showerhead 140. That is, the plasma is generated just in the processing chamber 110 according to the present embodiment.

While the above embodiment discusses the plasma generator positioned in the processing chamber 110, the plasma may also be generated outside the processing chamber 110, as would be known to one of the ordinary skill in the art. For example, the plasma is generated in a remote plasma generator positioned outside the processing chamber 110, and the plasma is supplied into the processing chamber 110.

Hereinafter, an operation of the apparatus 100 of the present invention is described in detail with reference to FIGS. 3A and 3B.

As shown in FIG. 3A, the substrate 120 is positioned in the processing chamber 110, and the driving member 142 downwardly drives the showerhead 140 close to the substrate 120 until the interval between the showerhead 140 and the substrate 120 is maintained to be a predetermined gap distance no more than about 25 mm. Then, the ALD process is performed at a first temperature of the substrate 120, thereby forming the first layer 170 on the substrate 120. When the gap distance is more than about 25 mm, there is a problem in that an efficiency of the subsequent purging process is markedly reduced. The ALD process for forming the first layer 170 is sufficiently described above, and any further description on the ALD process will be omitted.

A purge gas is provided into the processing chamber 110, and residual reactants including physisorbed reactants and other impurities are removed from the processing chamber 110. Then, the backside gas such as an argon (Ar) gas is supplied into the processing chamber 110, and the temperature of the substrate 120 is increased from the first temperature to the second temperature.

Referring to FIG. 3B, the driving member 142 upwardly drives the showerhead 140 far off from the substrate 120 until the interval between the showerhead 140 and the substrate 120 is maintained to a predetermined gap distance in a range from about 25 mm to about 80 mm. Then, the CVD process is performed at a second temperature of the substrate 120, thereby forming the second layer 180 on the substrate 120. When the gap distance is below about 25 mm, a flow of the source gases is unsteady due to the short interval between the showerhead 140 and the substrate 120, so that uniformity of the second layer is deteriorated. The gap distance above about 80 mm is undesirable from an economic point of view. The CVD process for forming the second layer 180 is sufficiently described above, and any further description on the CVD process will be omitted. Therefore, the thin layer 190 for a semiconductor device is formed to include the first layer 170 formed through the ALD process and the second layer 180 formed through the CVD process.

Figure 4:
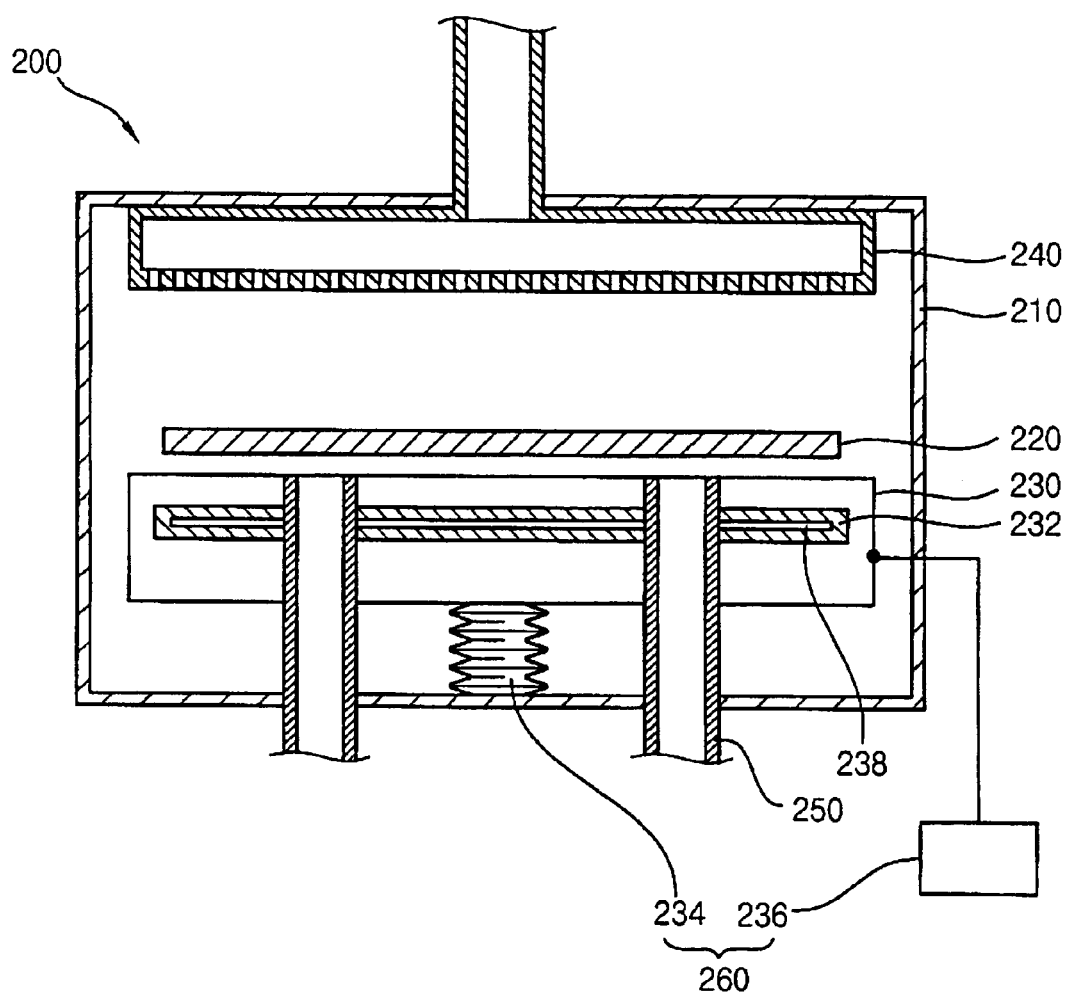
FIG. 4 is a cross sectional view illustrating an apparatus for forming a thin layer for a semiconductor device according to a second embodiment of the present invention.
Figure 5A:
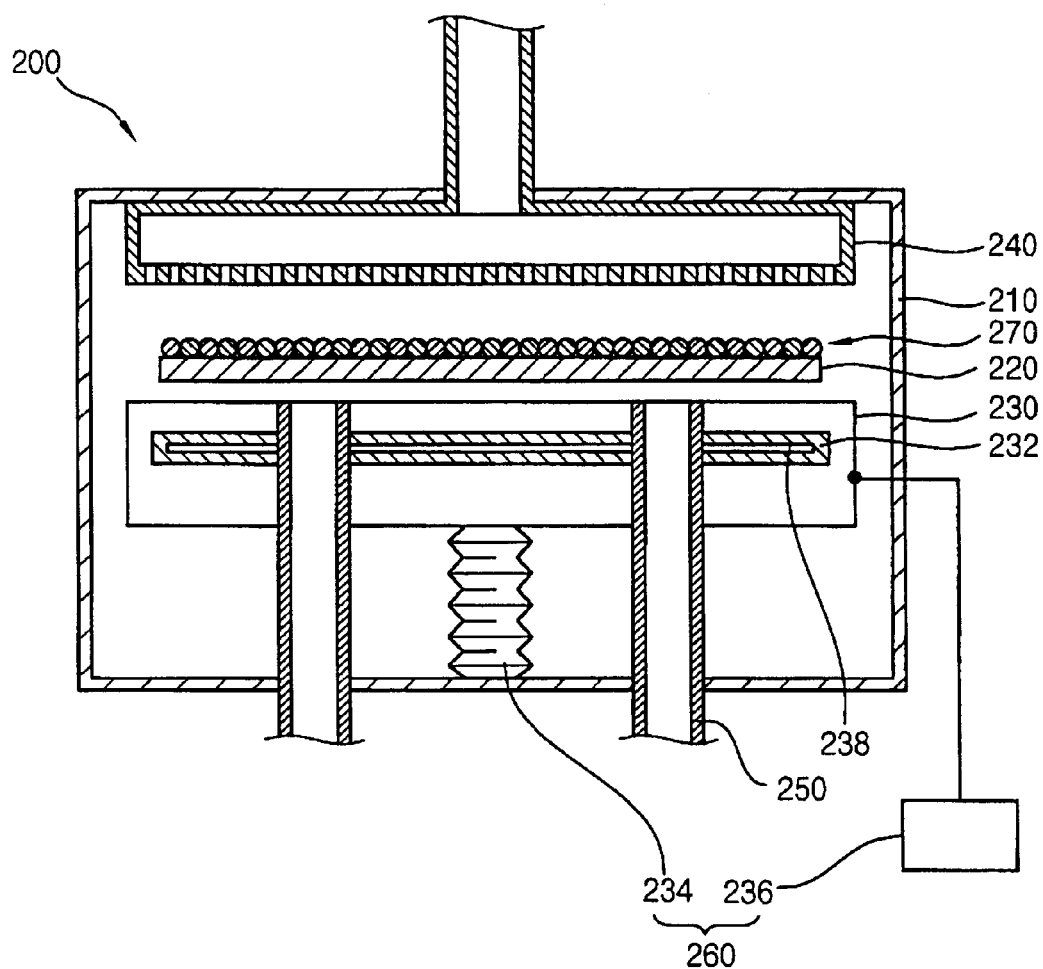
FIGS. 5A and 5B are schematic views illustrating first and second layers of the thin layer formed on a substrate in the apparatus shown in FIG. 4.
Figure 5B:
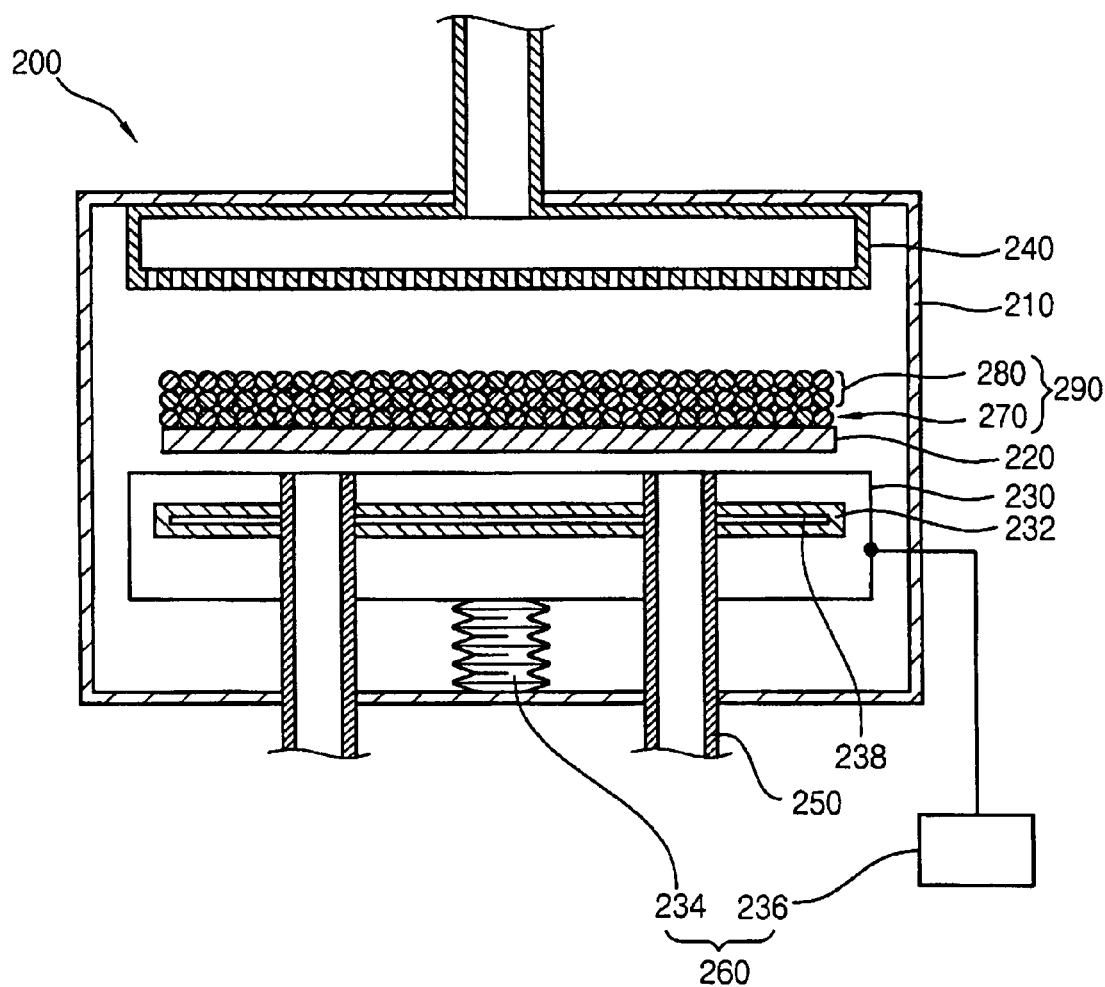

FIG. 4 is a cross sectional view illustrating an apparatus for forming a thin layer for a semiconductor device according to a second embodiment of the present invention. FIGS. 5A and 5B are schematic views illustrating first and second layers of the thin layer formed on a substrate in the apparatus shown in FIG. 4.

Referring to FIG. 4, an apparatus 200 for forming a thin layer for a semiconductor device according to a second embodiment of the present invention includes a processing chamber 210 in which a semiconductor substrate 220 is positioned, a showerhead 240 through which reactants are provided into the processing chamber 210, an adjusting unit 260 for adjusting a gap distance between the showerhead 240 and the substrate 220, and a stage 230 for supporting the substrate 220. The showerhead 240 is positioned in an upper portion of the processing chamber 210, and the stage 230 is positioned in a lower portion of the processing chamber 210 and faces the showerhead 240.

In the present embodiment, the adjusting unit 260 includes an extendable member 234 connected to both the stage 230 and a bottom portion of the chamber 210, and a driving member 236 for driving the stage 230.

The extendable member 234 may be extended or contracted as needed, thereby adjusting an interval between the showerhead 240 and the substrate 220 in accordance with a process for forming a layer on the substrate 220, for example, an ALD process or a CVD process. Examples of the extendable member 234 include a bellows or an antenna-structured tube. The driving member 236 includes a motor, a cylinder connected to a pressure source or a lead screw operated by manpower.

The driving member 236 is connected to the stage 230, and vertically drives the stage 230 close to the showerhead 240 or far off from the showerhead 240. While the present embodiment discloses the stage 230 driven by the driving member 236, a power source (not shown) for driving the extendable member 234 could be utilized for driving the stage 230, as would be known to one of the ordinary skill in the art. The power source drives the extendable member 234, and the stage 230 vertically moves close to the showerhead 240 or far off from the showerhead 240 in accordance as the extendable member 234 vertically moves, because the extendable member 234 is connected to the stage 230.

The stage 230 includes a heater 232 for increasing a temperature of the substrate 220. In the present embodiment, the heater 232 includes a heat exchanger 238 for controlling a temperature of the heater 232. As an exemplary embodiment, a heat medium of a predetermined temperature is circulated in the heat exchanger 238, or the heat exchanger 238 is exposed to a cooling gas on the whole.

In addition, the apparatus 200 may further include a feeding line 250 through which a backside gas is provided to a bottom surface of the substrate 220 via the stage 230. The backside gas may increase or decrease the temperature of the substrate 220 just like the heat exchanger 238 in the heater 232. That is, the backside gas may also control the temperature of the substrate 220. In the present embodiment, an argon (Ar) gas is exemplarily utilized as the backside gas. While both the feeding line 250 and the heat exchanger 238 are installed in the apparatus 200 of the present invention, just one of either the feeding line 250 or the heat exchanger 238 may also be installed in the apparatus 200 of the present invention, as would be known to one of the ordinary skill in the art.

The apparatus 200 of the present invention may further include a plasma generator (not shown) for generating plasma during the ALD process or the CVD process. The plasma generator may include an electrode (not shown) surrounding a gas supplying line (not shown), a radio frequency (RF) source (not shown) for applying a high frequency energy to a gas supplied to the gas supplying line, and a buffer space (not shown) under the electrode where a gas supplied to the gas supplying line is excited to a plasma by the RF source. The showerhead 240 is positioned under the buffer space, and the plasma is uniformly deposited onto the substrate 220 through the showerhead 240. That is, the plasma is generated just in the processing chamber 210 according to the present embodiment.

While the above embodiment discusses the plasma generator positioned in the processing chamber 210, the plasma may also be generated outside the processing chamber 210, as would be known to one of the ordinary skill in the art. For example, the plasma is generated in a remote plasma generator positioned outside the processing chamber 210, and the plasma is supplied into the processing chamber 210.

Hereinafter, an operation of the apparatus 200 of the present invention is described in detail with reference to FIGS. 5A and 5B.

As shown in FIG. 5A, the substrate 220 is positioned in the processing chamber 210, and the driving member 236 upwardly drives the stage 230 close to the showerhead 240 until the interval between the showerhead 240 and the substrate 220 is maintained to be a predetermined gap distance no more than about 25 mm. Then, the ALD process is performed at a first temperature of the substrate 220, thereby forming the first layer 270 on the substrate 220. The ALD process for forming the first layer 270 is sufficiently described above, and any further description on the ALD process will be omitted.

A purge gas is provided into the processing chamber 210, and residual reactants including physisorbed reactants and other impurities are removed from the processing chamber 210. Then, the backside gas such as an argon (Ar) gas is supplied into the processing chamber 210, and the temperature of the substrate 220 is increased from the first temperature to the second temperature.

Referring to FIG. 5B, the driving member 236 downwardly drives the stage 230 far off from the showerhead 240 until the interval between the showerhead 240 and the substrate 220 is maintained to a predetermined gap distance in a range from about 25 mm to about 80 mm. Then, the CVD process is performed at a second temperature of the substrate 220, thereby forming the second layer 280 on the substrate 220. The CVD process for forming the second layer 280 is sufficiently described above, and any further description on the CVD process will be omitted. Therefore, the thin layer 290 for a semiconductor device is formed to include the first layer 270 formed through the ALD process and the second layer 280 formed through the CVD process.

Figure 6:
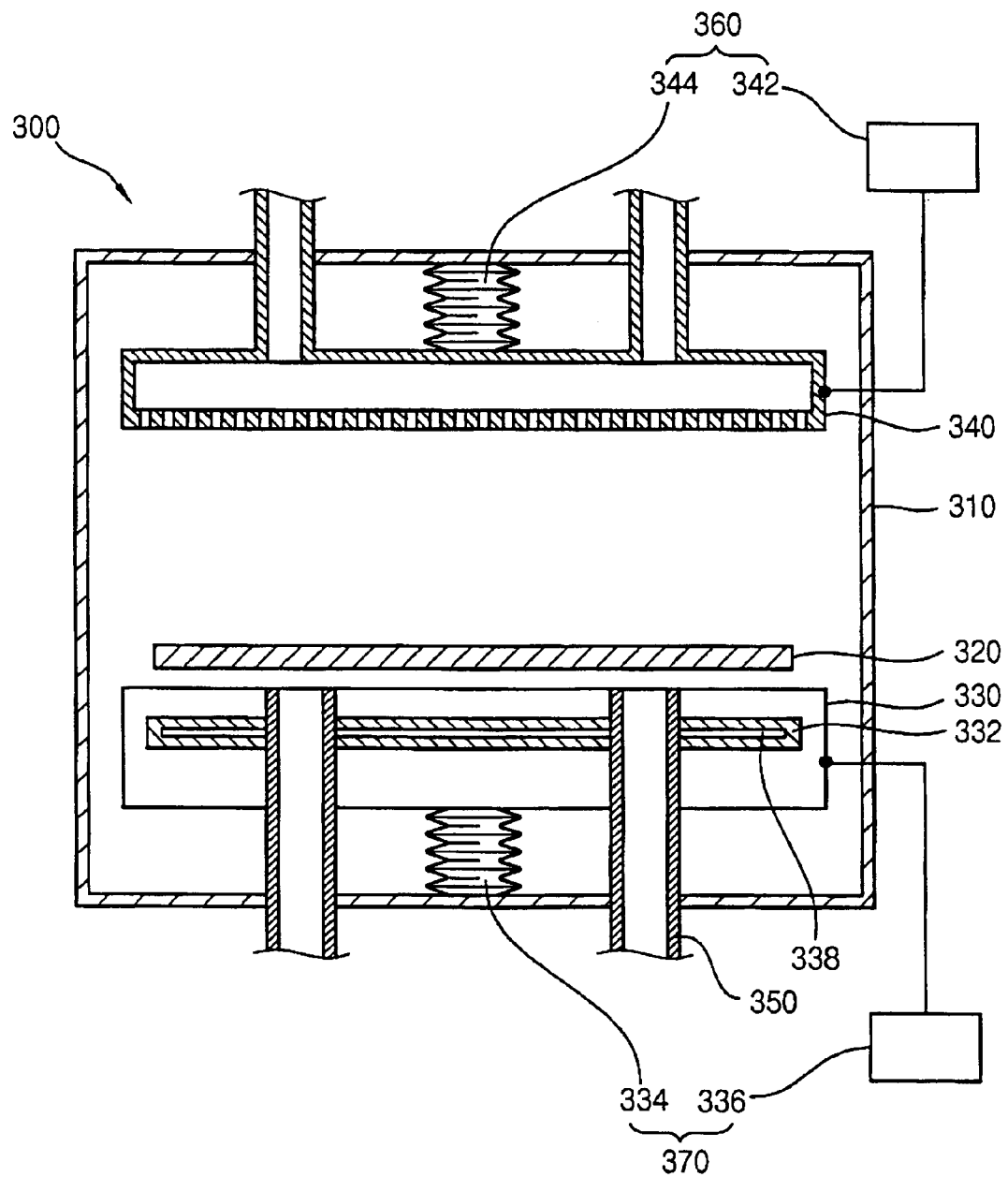
FIG. 6 is a cross sectional view illustrating an apparatus for forming a thin layer for a semiconductor device according to a third embodiment of the present invention.
Figure 7A:
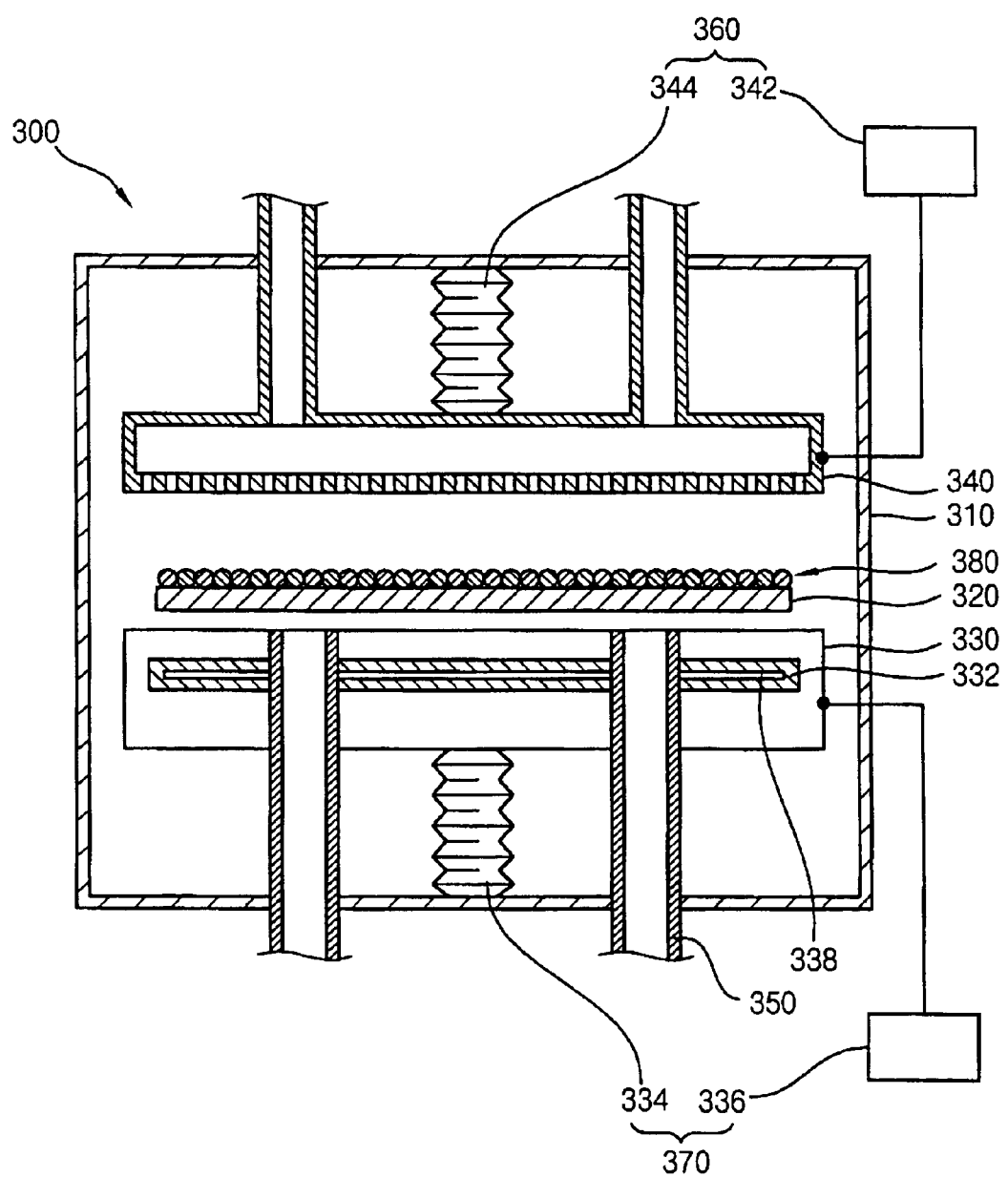
FIGS. 7A and 7B are schematic views illustrating first and second layers of the thin layer formed on a substrate in the apparatus shown in FIG. 6.
Figure 7B:
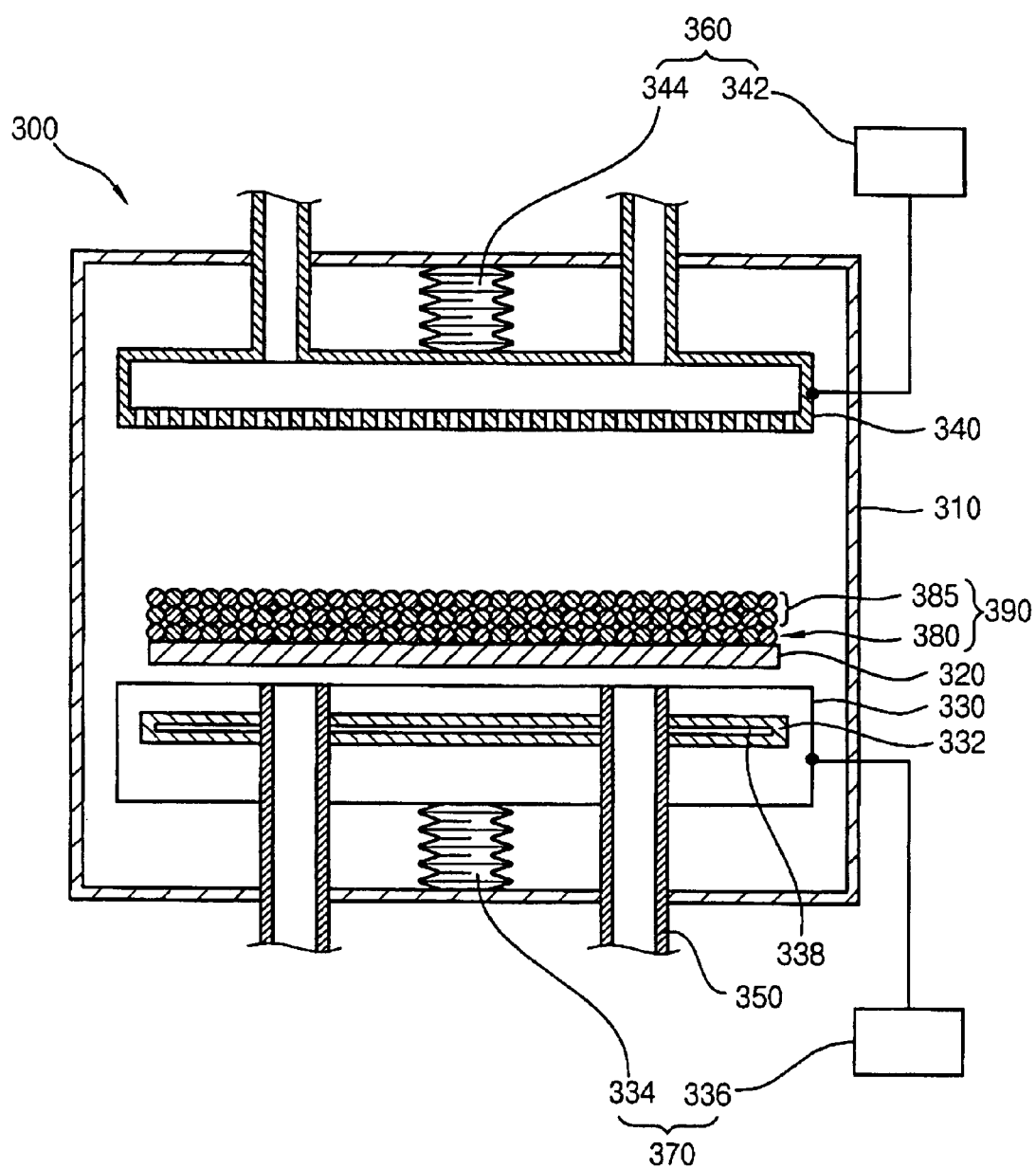

FIG. 6 is a cross sectional view illustrating an apparatus for forming a thin layer for a semiconductor device according to a third embodiment of the present invention. FIGS. 7A and 7B are schematic views illustrating first and second layers of the thin layer formed on a substrate in the apparatus shown in FIG. 6.

Referring to FIG. 6, an apparatus 300 for forming a thin layer for a semiconductor device according to a third embodiment of the present invention includes a processing chamber 310 in which a semiconductor substrate 320 is positioned, a showerhead 340 through which reactants are provided into the processing chamber 310, first and second adjusting units 360 and 370 for adjusting a gap distance between the showerhead 340 and the substrate 320, and a stage 330 for supporting the substrate 320. The showerhead 340 is positioned in an upper portion of the processing chamber 310, and the stage 330 is positioned in a lower portion of the processing chamber 310 and faces the showerhead 340.

In the present embodiment, the first adjusting unit 360 includes a first extendable member 344 connected to both the showerhead 340 and a top portion of the chamber 310, and a first driving member 342 for driving the showerhead 340. The second adjusting unit 370 includes a second extendable member 334 connected to both the stage 330 and a bottom portion of the chamber 310, and a second driving member 336 for driving the stage 330.

The first and second extendable members 344 and 334 may be extended or contracted as needed, thereby adjusting an interval between the showerhead 340 and the substrate 320 in accordance with a process for forming a layer on the substrate 320, for example, an ALD process or a CVD process. Examples of the first and second extendable member 344 and 334 include a bellows or an antenna-structured tube. The first and second driving members 342 and 336 include a motor, a cylinder connected to a pressure source or a lead screw operated by manpower.

The first driving member 342 is connected to the showerhead 340, and vertically drives the showerhead 340 close to the substrate 320 or far off from the substrate 320. The second driving member 336 is connected to the stage 330, and vertically drives the stage 330 close to the showerhead 340 or far off from the showerhead 340. While the present embodiment discloses the showerhead 340 driven by the first driving member 342, a first power source (not shown) for driving the first extendable member 344 could be utilized for driving the showerhead 340, as would be known to one of the ordinary skill in the art. The first power source drives the first extendable member 344, and the showerhead 340 vertically moves close to the substrate 320 or far off from the substrate 320 in accordance as the first extendable member 344 vertically moves, because the first extendable member 344 is connected to the showerhead 340. In the same way, a second power source (not shown) for driving the second extendable member 334 could be utilized for driving the stage 330, as would be known to one of the ordinary skill in the art. The second power source drives the second extendable member 334, and the stage 330 vertically moves close to the showerhead 340 or far off from the showerhead 340 in accordance as the second extendable member 334 vertically moves, because the second extendable member 334 is connected to the stage 330.

The stage 330 includes a heater 332 for increasing a temperature of the substrate 320. In the present embodiment, the heater 332 includes a heat exchanger 338 for controlling a temperature of the heater 332. As an exemplary embodiment, a heat medium of a predetermined temperature is circulated in the heat exchanger 338, or the heat exchanger 338 is exposed to a cooling gas on a whole.

In addition, the apparatus 300 may further include a feeding line 350 through which a backside gas is provided to a bottom surface of the substrate 320 via the stage 330. The backside gas may increase or decrease the temperature of the substrate 320 just like the heat exchanger 338 in the heater 332. That is, the backside gas may also control the temperature of the substrate 320. In the present embodiment, an argon (Ar) gas is exemplarily utilized as the backside gas. While both the feeding line 350 and the heat exchanger 338 are installed in the apparatus 300 of the present invention, just one of either the feeding line 350 or the heat exchanger 338 may also be installed in the apparatus 300 of the present invention, as would be known to one of the ordinary skill in the art.

The apparatus 300 of the present invention may further include a plasma generator (not shown) for generating plasma during the ALD process or the CVD process. The plasma generator may include an electrode (not shown) surrounding a gas supplying line (not shown), a radio frequency (RF) source (not shown) for applying a high frequency energy to a gas supplied to the gas supplying line, and a buffer space (not shown) under the electrode where a gas supplied to the gas supplying line is excited to a plasma by the RF source. The showerhead 340 is positioned under the buffer space, and the plasma is uniformly deposited onto the substrate 320 through the showerhead 340. That is, the plasma is generated just in the processing chamber 310 according to the present embodiment.

While the above embodiment discusses the plasma generator positioned in the processing chamber 310, the plasma may also be generated outside the processing chamber 310, as would be known to one of the ordinary skill in the art. For example, the plasma is generated in a remote plasma generator positioned outside the processing chamber 310, and the plasma is supplied into the processing chamber 310.

Hereinafter, an operation of the apparatus 300 in FIG. 6 of the present invention is described in detail with reference to FIGS. 7A and 7B.

As shown in FIG. 12A, the substrate 320 is positioned in the processing chamber 310. The first driving member 342 downwardly drives the showerhead 340 and the second driving member 336 upwardly drives the stage 330 close to the showerhead 340 until the interval between the showerhead 340 and the substrate 320 is maintained to be a predetermined gap distance no more than about 25 mm. Then, the ALD process is performed at a first temperature of the substrate 320, thereby forming the first layer 380 on the substrate 320. The ALD process for forming the first layer 380 is sufficiently described above, and any further description on the ALD process will be omitted.

A purge gas is provided into the processing chamber 310, and residual reactants including physisorbed reactants and other impurities are removed from the processing chamber 310. Then, the backside gas such as an argon (Ar) gas is supplied into the processing chamber 310, and the temperature of the substrate 320 is increased from the first temperature to the second temperature.

Referring to FIG. 7B, the first driving member 342 upwardly drives the showerhead 340 and the second driving member 336 downwardly drives the stage 330 far off from the showerhead 340 until the interval between the showerhead 340 and the substrate 320 is maintained to a predetermined gap distance in a range from about 25 mm to about 80 mm.

Then, the CVD process is performed at a second temperature of the substrate 320, thereby forming the second layer 385 on the substrate 320. The CVD process for forming the second layer 385 is sufficiently described above, and any further description on the CVD process will be omitted. Therefore, the thin layer 390 for a semiconductor device is formed to include the first layer 380 formed through the ALD process and the second layer 385 formed through the CVD process.

The following describes an experiment on an amount of impurities in relation to an amount of $TiCl_4$ gas. When a titanium nitride layer is formed using a titanium tetrachloride ($TiCl_4$) gas, the titanium tetrachloride ($TiCl_4$) is reacted with an underlying layer that has been already formed; thus, a quantity of impurities is generated in the processing chamber. For example, when the titanium nitride layer is utilized as an upper electrode layer of a capacitor of a semiconductor device, the titanium tetrachloride ($TiCl_4$) is reacted with a hafnium oxide ($HfO_x$) layer or an aluminum oxide ($Al_2O_3$) layer that is widely utilized as a dielectric layer of the capacitor. The titanium tetrachloride ($TiCl_4$) causes damage to the dielectric layer, which is an underlying layer with respect to the upper electrode layer of the capacitor, by a chemical reaction with the dielectric layer expressed as the following chemical formula (1).

$$TiCl_4 + HfO_2 \rightarrow HfCl_4(g) + TiO_2(s) \qquad (1)$$

As indicated in the chemical formula (1), the titanium tetrachloride ($TiCl_4$) gas is reacted with hafnium oxide ($HfO_x$), and generates products of hafnium tetrachloride ($HfCl_4$) gas and titanium dioxide ($TiO_2$). The metal chloride gas and titanium oxide function as impurities during the process for forming the titanium nitride layer.

Based on the above chemical analysis, a correlation between an amount of the titanium tetrachloride and an amount of the impurities was experimentally researched as follows.

In the above experiment, about 1 mole of $HfO_2$ was reacted to about 1 mole, 10 moles and 100 moles of $TiCl_4$, respectively, under the conditions of a pressure of about 0.01 atm and a temperature of 600° C. Then, an amount of the $HfCl_4$ was measured in a mole unit, and a mole ratio of the $HfCl_4$ with respect to the $HfO_2$ was calculated at an equilibrium state, as shown in Table 3.

TABLE 3

| $TiCl_4$ (mole) | Amount of $HfCl_4$ (mole) | Mole Ratio of $HfCl_4$ with Respect to $HfO_2$ (%) |
|---|---|---|
| 1 | 3.3731E−03 | 0.34 |
| 10 | 3.3731E−02 | 3.4 |
| 100 | 3.3731E−01 | 34 |

As shown in Table 3, the amount of the $HfCl_4$ was proportional to the amount of the $TiCl_4$. The experimental results shown in Table 3 indicate that the titanium chloride is required to be provided at a relatively smaller volume rate at the beginning of the process since the reactant has a great possibility of chemical reaction with the underlying layer at the beginning of the process. The above experimental results support the reason why the titanium chloride is provided at a volume rate of about 25 sccm, and more preferably at a volume rate no more than about 10 sccm in the present embodiment.

The following describes an experiment on an amount of impurities in relation to a deposition temperature of TiN layer.

Based on the above chemical analysis during the formation process of the TiN layer, a correlation between an amount of the impurities and a deposition temperature of the titanium nitride (TiN) layer was experimentally researched as follows.

In the experiment, about 1 mole of $HfO_2$ was reacted with about 1 mole of $TiCl_4$ at a temperature of 450° C., 500° C., 550° C., 600° C. and 650° C., respectively, under the condition that the pressure was maintained to be about 0.01 atm. Then, an amount of the $HfCl_4$ was measured in a mole unit, and a mole ratio of the $HfCl_4$ with respect to the $HfO_2$ was calculated at an equilibrium state, as shown in Table 4.

TABLE 4

Test of Ideal First Temperature of Reactance

| Temperature (° C.) | Amount of $HfCl_4$ (mole) | Mole Ratio of $HfCl_4$ with Respect to $HfO_2$ (%) |
|---|---|---|
| 450 | 0.5240E−03 | 0.05 |
| 500 | 0.1075E−02 | 0.11 |
| 550 | 1.9874E−02 | 1.9 |
| 600 | 3.3731E−02 | 3.4 |
| 650 | 5.3339E−02 | 5.3 |

As shown in Table 4, the amount of $HfCl_4$ gas was increased as the processing temperature was increased when the amount of the $HfO_2$ and the amount of the $TiCl_4$ were the same. However, the above experimental results also show that the amount of the $HfCl_4$ was remarkably reduced when the deposition temperature was below about 550° C.

Accordingly, the above experimental results shown in Table 4 indicate that the titanium nitride requires to be deposited at a relatively lower temperature at the beginning of the deposition process since the reactant has a great possibility of chemical reaction with the underlying layer at the beginning of the process. In particular, the above experimental results show that the amount of the $HfCl_4$ was the smallest at the deposition temperature no more than about 550° C. The above experimental results on the deposition temperature also support the reason why the first temperature is set to be no more than about 550° C. when the first layer is formed through the ALD process in the present invention. As a result, when the titanium nitride layer is formed as the thin layer for the semiconductor device of the present invention, the chemical reaction between titanium chloride and an underlying layer is suppressed, so that the amount of the impurities during the formation of the first layer is minimized.

The following describes an experiment on a uniformity of the thin layer in relation to the gap distance. Based on the above chemical analysis during the formation process of the TiN layer, a correlation between a uniformity of the thin layer and the gap distance between the showerhead and the substrate in the processing chamber was experimentally researched as follows.

The titanium nitride (TiN) layer was formed in the same way as in the embodiments shown in FIGS. 2, 4 and 6 except for the gap distance between the showerhead and the substrate. The first layer was formed through the ALD process and the second layer was formed through the CVD process with the gap distance of about 25 mm, 30 mm, 40 mm and 45 mm, respectively. Then, a dispersion degree of the first and second layers was measured, respectively, in accordance to the gap distance, as shown in Table 5.

TABLE 5

Uniformity Test by Gap Distance

| | Gap Distance (mm) | | | |
|---|---|---|---|---|
| | 25 | 30 | 40 | 45 |
| First Layer (%) | 4.9 | 6.1 | 6.4 | 6.5 |
| Second Layer (%) | 20 | 14.5 | 8.7 | 5.3 |

As shown in Table 5, the greater the gap distance was, the larger the dispersion degree of the first layer was, so that the uniformity of the first layer formed through the ALD process was deteriorated as the gap distance was increased. However, the greater the gap distance was, the smaller the dispersion degree of the second layer was, so that the uniformity of the second layer formed through the CVD process was improved as the gap distance was increased.

Accordingly, the above experimental results shown in Table 5 indicate that the gap distance is required to be no less than about 25 mm during the CVD process, and to be no more than about 25 mm during the ALD process. The above experimental results on the gap distance support the reason why the gap distance is set to be no more than about 25 mm when the first layer is formed through the ALD process and the gap distance is set in a range from about 25 mm to about 80 mm when the second layer is formed through the CVD process in the present invention.

The following describes an experiment testing the manufacturing throughput of a semiconductor device using the above methods. A first titanium nitride layer was formed on a substrate to a thickness of 380 Å through an ALD process at a temperature of about 530° C. and a second nitride layer was formed on a substrate to a thickness of 380 Å through a CVD process at a temperature higher than 530° C. Then, a third titanium nitride layer including a first layer and a second layer was formed on a substrate to a thickness of 280 Å through an ALD process and a CVD process sequentially at a temperature higher than 530° C. in the same chamber according to the present invention. In particular, the first layer is formed on the substrate to a thickness of about 30 Å through the ALD process, and the second layer is formed on the first layer to a thickness of about 250 Å through the CVD process. Then, a deposition time of each TiN layer and a manufacturing throughput (number of wafer handled per hour) of a semiconductor device including each TiN layer were measured, as shown in Table 6.

TABLE 6

Throughput of Manufacturing Process

| | First TiN layer | Second TiN layer | Third TiN layer |
|---|---|---|---|
| Deposition Time (sec) | 2926 | 75 | 235 + 40 = 275 |
| Manufacturing Throughput (wf/hr) | 2.6 | 12.0 | 9.3 |

The first layer of the third TiN layer was formed in 235 seconds through the ALD process, and the second layer of the third TiN layer was formed in 40 seconds through the CVD process, so that the third TiN layer was formed in 275 seconds through the sequential process of the ALD and CVD. As shown in Table 6, while the deposition time of the second layer formed through a CVD process is about 40 times shorter than that of the first layer formed through an ALD process, the manufacturing throughput of the first layer is about one-fourth as much as that of the second layer. Even though the manufacturing throughput is slightly reduced as compared with the second TiN layer, the deposition time and manufacturing throughput of the third TiN layer was remarkably improved as compared with that of the first TiN layer. Accordingly, the third TiN layer remarkably improves the manufacturing throughput of a semiconductor device as compared with a semiconductor device including the first TiN layer. In addition, an underlying layer under the third TiN layer in a semiconductor device is prevented from being deteriorated due to the first layer of the third TiN layer formed through an ALD process, so that the third layer has an advantage as compared with the second TiN layer formed through a CVD process from an economic point of view.

According to a present invention, a thin layer including a first layer and a second layer for a semiconductor device is formed through an ALD process and a CVD process in the same chamber. The first layer is formed through the ALD process, thereby preventing a diffusion of the first layer into an underlying layer, and the second layer is formed through the CVD process, thereby improving a manufacturing throughput of a semiconductor device. As a result, the thin layer of the present invention has good layer characteristics and few layer defects, so that the manufacturing throughput of a semiconductor device is satisfactorily improved.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming a thin layer on a semiconductor substrate, comprising:
   forming a first layer on the substrate at a first temperature of below about 550°C. in a processing chamber through an atomic layer deposition (ALD) process; and
   forming a second layer on the first layer at a second temperature of above about 550°C. in the processing chamber through a chemical vapor deposition (CVD) process, wherein forming the first layer includes:
   providing a first reactant of titanium chloride into the processing chamber, so that a monolayer is formed on the substrate by a chemisorption of the first reactant to the substrate;
   providing a first purge gas into the processing chamber, so that a portion of the first reactant that is not chemisorbed to the substrate is removed from the processing chamber;
   providing a second reactant of ammonia ($NH_3$) gas or nitrogen ($N_2$) gas into the processing chamber, so that the first layer is formed on the substrate by a chemisorption of the second reactant to the monolayer; and
   providing a second purge gas into the processing chamber, so that a portion of the second reactant that is not chemisorbed to the monolayer and residual gases are removed from the processing chamber.

2. The method of claim 1, wherein providing the first reactant, providing the first purge gas, providing the second reactant and providing the second purge gas are repeated at least two times.

3. The method of claim 1, wherein the first reactant is provided at a volume rate no more than about 25 standard cubic centimeter per minute (sccm).

4. The method of claim 3, wherein the first reactant is provided at a volume rate no more than about 10 sccm.

5. The method of claim 1, wherein forming the second layer includes:
   introducing source gases, including titanium chloride gas, into the processing chamber at a volume rate no less than about 20 sccm; and
   depositing a product of chemical reactions between the source gases, thereby forming the second layer on the first layer, wherein the first temperature is below about 550°C.

6. The method of claim 1, wherein the thin layer includes a titanium nitride layer.

7. The method of claim 1, wherein the thin layer includes a diffusion barrier layer between the semiconductor substrate and a copper wiring layer formed overtop the thin layer.

8. The method of claim 1, wherein the first layer is formed to a thickness of about 20 Å to about 80 Å.

9. The method of claim 8, wherein the first layer is formed to a thickness of about 35 Å to about 65 Å.

10. The method of claim 1, wherein the second layer is formed to a thickness of about 150 Å to about 400 Å.

11. The method of claim 1, wherein the thin layer is formed to a thickness of about 170 Å to about 480 Å.

* * * * *

UNITED STATES PATENT AND TRADEMARK OFFICE
CERTIFICATE OF CORRECTION

PATENT NO. : 7,439,192 B2  Page 1 of 1
APPLICATION NO. : 11/154110
DATED : October 21, 2008
INVENTOR(S) : Jung-Hun Seo et al.

It is certified that error appears in the above-identified patent and that said Letters Patent is hereby corrected as shown below:

Title Page item [57] in the Abstract, line 8, the word "adjuted" should read --adjusted--.

Signed and Sealed this

Thirteenth Day of July, 2010

David J. Kappos
*Director of the United States Patent and Trademark Office*